United States Patent
Li et al.

(10) Patent No.: US 7,132,316 B2
(45) Date of Patent: Nov. 7, 2006

(54) AFTER DEPOSITION METHOD OF THINNING FILM TO REDUCE PINHOLE DEFECTS

(75) Inventors: Wai-Kin Li, Poughkeepsie, NY (US); Colin J. Brodsky, Salt Point, NY (US); Steven A. Scheer, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 11/029,812

(22) Filed: Jan. 5, 2005

(65) Prior Publication Data

US 2006/0148265 A1 Jul. 6, 2006

(51) Int. Cl.
*H01L 21/00* (2006.01)
*H01L 21/8238* (2006.01)

(52) U.S. Cl. ............... 438/149; 438/166; 438/213; 257/127

(58) Field of Classification Search ........... 438/149, 438/166; 257/E21.383, E29.011, E29.198, 257/127; 428/213
See application file for complete search history.

(56) References Cited

U.S. PATENT DOCUMENTS

| | | | | |
|---|---|---|---|---|
| 5,985,704 | A * | 11/1999 | Adachi et al. | 438/166 |
| 6,607,993 | B1 * | 8/2003 | Dickinson et al. | 438/795 |
| 6,911,400 | B1 * | 6/2005 | Colburn et al. | 438/758 |
| 2006/0147849 | A1 * | 7/2006 | Scheer et al. | 430/330 |

OTHER PUBLICATIONS

Linliu et al. teach A Novel CVD Polymeric Anti-Reflective Coating (PARC) for DRAM, Flash and Logic Device with 0.1 um CoSi2 Gate (2000 Symposium on VLSI Technology Digest of Technical Papers; p. 50-51).*

Chen et al. teach Reduction Substrate Alkaline Contamination by Utilizing Multi-Layer Bottom Antireflective Coating Structures in ArF lithography (p. 230-231 in Section 1D-6-48).*

Yang et al. teach Effect of Physical Stress on the Degradation of Thin SiO2 Films Under Electrical Stress (IEEE Transactions on Electron Devices, vol. 47, No. 4, Apr. 2000; pp. 746-755).*

U.S. Appl. No. 10/880,818 filed Jun. 30, 2004 Titled: "Film Stack Having Under Layer for Preventing Pinhole Defects".

D. E. Seeger et al., "Thin-film Imaging: Past, Present, Prognosis," *IBM Jnl. Res. Develop. (Optical Lithography)* vol. 41, No. 1/2, p. 105 (1997).

D. Taylor et al., "Measuring and Accessing Printability of Reticle Pinhole Defects," *Proc. SPIE* (18th Europ. Conf. On Mask Technology for Integrated Circuits and Microcomponents , vol. 4764, pp. 202-209 (2002) (Abstract Only).

(Continued)

*Primary Examiner*—Walter Lindsay, Jr.
*Assistant Examiner*—Thu-Huong Dinh

(74) *Attorney, Agent, or Firm*—Steven Capella (57) ABSTRACT

A method of forming a thin film is provided in which a film having a first thickness is deposited over a substrate, wherein the first thickness is greater than a thickness at which the initially deposited film begins to dewet from the substrate. The initially deposited film is then stabilized to form a stabilized film. Thereafter, the stabilized film is then thinned to a second thickness, such that the resulting film now has a smaller thickness than the thickness at which the initially deposited film would begin to dewet from the substrate. However, as a result of the prior stabilization, the reduced thickness film remains free of dewetting defects.

11 Claims, 5 Drawing Sheets

OTHER PUBLICATIONS

G. Reiter et al., "Thin Film Instability Induced By Long Range Forces," *Langmuir*, vol. 15, pp. 2551-2558 (1999).

R. Seemann et al., "Dewetting Patterns and Molecular Forces: A Reconciliation," *Physical Review Letters*, vol. 86, No. 24, pp. 5534-5537 (2001).

S. Nir, "Van Der Waals Interactions Between Surfaces of Biological Interest," *Progress In Surface Science*, vol. 8, No. 1, pp. 1-58 (1976).

J. N. Israelachvili, *Intermolecular and Surface Forces* (London Academic Press), pp. 176-209.

* cited by examiner

AFTER DEPOSITION METHOD OF THINNING FILM TO REDUCE PINHOLE DEFECTS

BACKGROUND OF THE INVENTION

The present invention relates to the processing of thin films, such as those used in the processing of very small structures such as microelectronic devices, for example.

The industry goal of reducing the size of microelectronic devices places greater demands on photolithography as a technology. As more aggressive solutions are pursued to meet such increased demands, thinner polymer films have to be used as anti-reflective coatings (ARCs) and in photoresist imaging layers. The use of thin polymer films, unfortunately, most often leads to device defects, such as those that occur due to long range van der Waals forces. Due to Van der Waals forces, localized thinning of a polymer film on a substrate occurs when the polymer film has insufficient thickness to overcome a tendency to dewet from the substrate. This leads to dewetting defects, also known as "pinhole" defects. An example of this phenomenon is illustrated in FIG. 1 for a bottom anti-reflective coating (BARC) layer disposed on a substrate of silicon dioxide.

Figure 1:
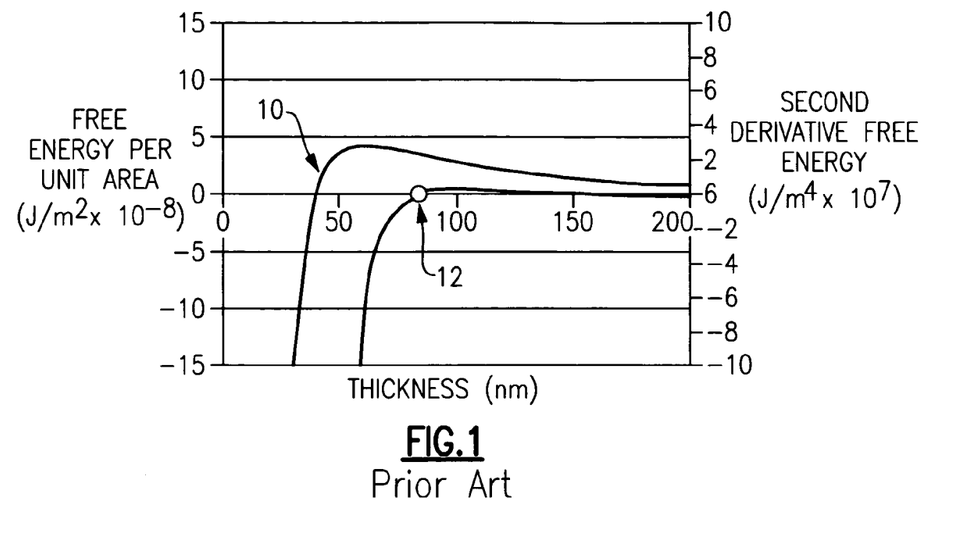
FIG. 1 is a graph illustrating free energy and a second derivative thereof for an anti-reflective coating (ARC) as a function of a thickness of the film overlying a substrate.

FIG. 1 illustrates a free energy curve 10 for a BARC layer disposed on a substrate of silicon dioxide, and a second curve 12 being the second derivative of the free energy curve 10. The BARC layer becomes unstable and has a tendency to dewet catastrophically at a thickness (50 nm) below which the free energy curve 10 turns sharply lower and heads negative. Such catastrophic dewetting is referred to as spinodal dewetting. The location of the zero in the second curve 12 illustrating the second derivative of free energy indicates a crossover point at about 85 nm between a film that dewets spinodally below that thickness and dewets via nucleation and growth of holes above that thickness.

As further shown in FIG. 1, as the overall film thickness is increased, the free energy of the film passes through a maximum and starts to decrease slowly as the film thickness continues to be increased. In the thickness regime just beyond the thickness at which the film spinodally dewets, the film is metastable and can still dewet via a different mechanism. If at some localized point in the film the thickness falls below the 85 nm thickness of the crossover point, the film becomes locally unstable and dewets by a mechanism known as dewetting via nucleation and growth of holes. Consequently, by examining the curves presented in FIG. 1, a BARC film having a thickness of 80 nm, which is less than the crossover point thickness of 85 nm, is highly unstable, and dewets spinodally, rapidly dewetting to droplets. On the other hand, a BARC film having a thickness of 110 nm, does not dewet spinodally, but can still dewet locally via nucleation and growth of holes. When the thickness of the film is increased, however, the occurrence of defects becomes less likely. For example, a BARC film having a thickness of 200 nm is so far from the crossover point on the free energy diagram that random local fluctuations in film thickness no longer result in local instability of the film.

Heretofore, there has been no known solution to this problem other than to increase the thickness of the film, which runs contrary to the industry goal of reducing device size. In addition, advanced lithography processes call for reductions rather than increases in film thicknesses, especially since a thick BARC film unnecessarily increases the difficulty of etching through the BARC film. Similarly, a thick photoresist imaging layer also increases risk of line pattern collapse and reduces the process window.

Currently, it is common to utilize surface treatments such as hexamethyldisilazane (HMDS) prime, prior to applying a coating such as an ARC or a photoresist. Such treatment promotes adhesion by changing the surface tension, and can also affect wettability of the coating by changing the spreading coefficient. However, even when a coating has a positive spreading coefficient, pinholes can still form when instability is present due to long range van der Waals forces. Therefore, pre-treating a surface with a surface treatment such as an HMDS prime, while affecting the size and shape of dewetting defects, does not prevent them from appearing in the first instance.

Accordingly, it would be desirable to provide a method by which the thickness of a film utilized in semiconductor fabrication can be reduced while precluding defects in the film caused by long range van der Waals forces.

SUMMARY OF THE INVENTION

According to an aspect of the invention, a method is provided for forming a thin film in which a film having a first thickness is deposited over a substrate, the first thickness being greater than a thickness at which the initially deposited film begins to dewet from the substrate. The initially deposited film is then stabilized to form a stabilized film. Thereafter, the stabilized film is then thinned to a second thickness, such that the resulting film now has a smaller thickness than the thickness at which the initially deposited film would begin to dewet from the substrate. However, because of the prior stabilization, the film now having the smaller thickness remains free of dewetting defects.

According to another aspect of the invention, a method is provided for forming photoresist patterns. In such method, an antireflective coating (ARC) is formed to overlie a substrate, the ARC having a negative Hamaker constant. Thereafter, a photoresist film is initially deposited to a first thickness over the ARC, such that the first thickness is greater than a thickness at which the photoresist film begins to dewet from the substrate when deposited directly onto the ARC. The initially deposited photoresist film is thereafter stabilized, e.g., such as by heating to cause a solvent to leave, to form a stabilized photoresist film. The stabilized photoresist film is then thinned to a second thickness, in which the second thickness is lower than the thickness at which the initially deposited photoresist film would begin to dewet from the ARC. However, the photoresist film having the reduced, second thickness remains free of dewetting defects. Thereafter, the thinned photoresist film is photolithographically patterned to form photoresist patterns.

Preferably, the thus formed photoresist patterns are subsequently used to pattern the underlying ARC, and features of the substrate then patterned using the photoresist patterns and the ARC patterns.

DETAILED DESCRIPTION

Figure 2:
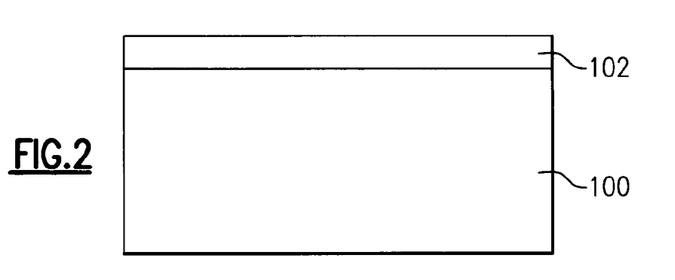
FIGS. 2 through 4 are sectional diagrams illustrating stages in a method of depositing and thinning a film after deposition according to one embodiment of the invention.
Figure 3:
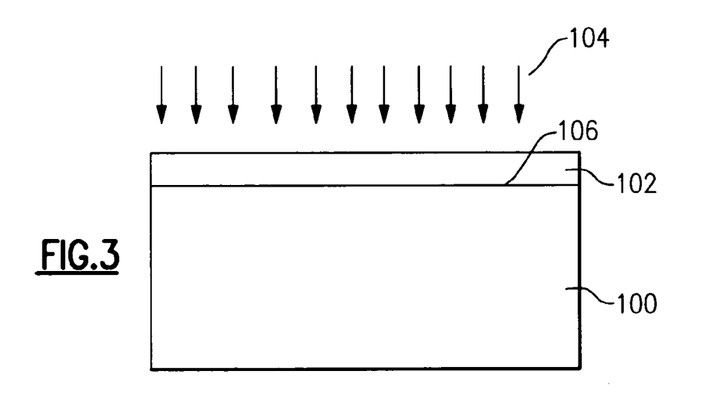
Figure 4:
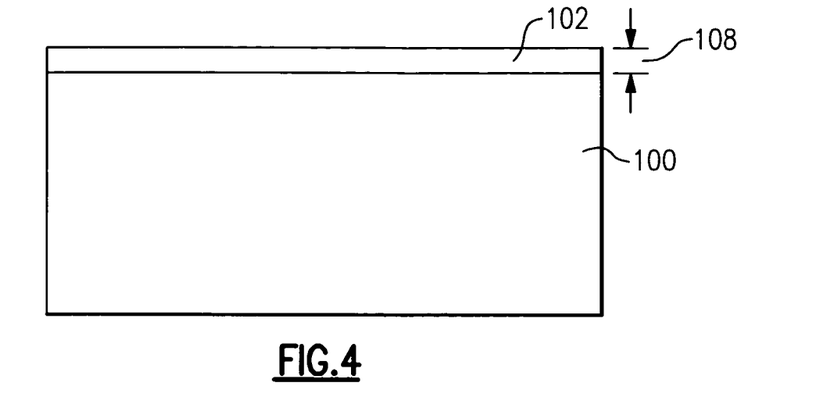

Accordingly, stages in processing according to a first embodiment of the invention are illustrated in FIGS. 2 through 4. As illustrated in FIG. 2, in an initial stage of processing a film 102 is deposited to overlie a substrate 100. By "substrate" is meant a base region, or alternatively, an exposed layer of a multiple layered substrate, in which case the exposed layer has significantly greater thickness than the thickness of the film. The characteristics of the film and the substrate are such as those discussed above. That is, the film 102 is subject to spinodal dewetting from the substrate 100 when its thickness is less than the thickness at the crossover point 12 (FIG. 1) determined from the second derivative of its free energy curve.

In view of the above concerns, the film 102 is deposited to a thickness which is substantially greater than the thickness at point 12 in FIG. 1, such that a film is obtained which is substantially free of pinholes and other similar defects. The film is deposited to a greater thickness than that at which the deposited film ordinarily begins to exhibit dewetting defects, e.g., pinholes, such as caused by nucleation and growth of holes.

As an example of the materials involved, the substrate may consist essentially of silicon dioxide, e.g., as a dielectric region of a semiconductor substrate and the film may consist essentially of an organic-based material used in photolithographic patterning such as a photoresist or an anti-reflective coating (ARC).

After the film is deposited, a process is conducted to stabilize the deposited film before proceeding. When the film is organic-based, such as a photoresist or an ARC, baking the film at an elevated temperature for a sufficient period of time has an effect of causing a solvent to leave the deposited film, and may also cause cross-linking among polymers and/or monomers in the deposited film. Through baking, the film becomes stabilized such that it is more capable of withstanding the forces which have a tendency to cause the film to dewet from the substrate 100. As one example, a post-apply-bake ("PAB") process can be performed such as that usually performed after applying a photoresist material, although the temperature and time at elevated temperature may vary from that at which a photoresist layer is typically baked.

Thereafter, as illustrated in FIG. 3, a process is performed to thin the stabilized film to a desirable thickness. The end result of this process is to provide a film 102 overlying the substrate 100 in which the film 102 has a thickness less than the thickness at which the film when first deposited would ordinarily begin to dewet from the substrate 100. However, because the film has been stabilized prior to being thinned, the film remains free of dewetting defects. As illustrated in FIG. 3, in one embodiment, the thickness of the film 102 is decreased by directional etching, e.g., through a reactive ion etch or a plasma dry etch, as indicated by arrows 104. However, alternatively, a wet etch process, e.g., an isotropic wet etch process; can be used to decrease the thickness of the film 102 to a desired height above underlying features of the substrate. In the embodiment shown, the major surface 106 of the substrate presents a substantially planar surface and the thickness of the film 102 is reduced by the etching the film 102 to a desirable height above the major surface 106.

FIG. 4 illustrates the final result of processing according to this embodiment, in which the processed film 102 now has a thickness 108 which is smaller than the originally deposited thickness which was required in order to prevent detrimental dewetting defects at time of deposition. However, the reduction in thickness has not harmed the characteristics of the resulting film. The film 102 remains free of dewetting defects.

Figure 5:
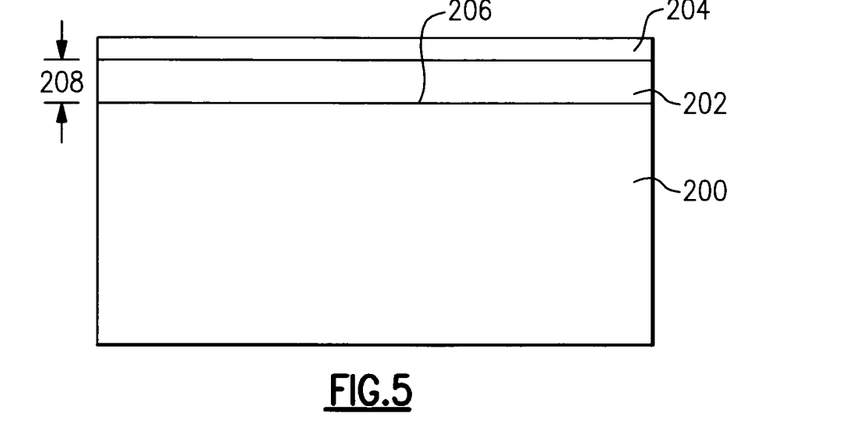
FIGS. 5 and 6 are sectional diagrams illustrating stages in a method of depositing and thinning a film after deposition according to another embodiment of the invention.
Figure 6:
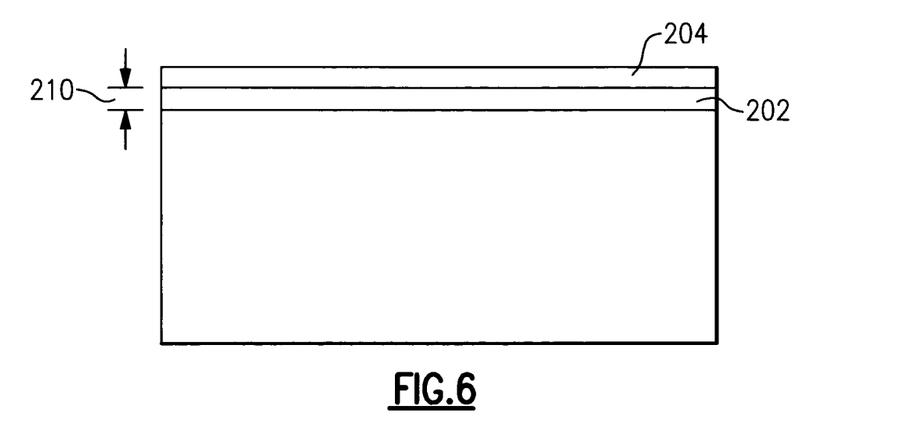

FIGS. 5 and 6 illustrate a second embodiment of the invention which is similar to the above-described embodiment, but in which a different mechanism is used to reduce the thickness of the deposited film to a desirable thickness. As illustrated in FIG. 5, a film 202 such as a photoresist or an ARC is deposited over a major surface 206 of a substrate 200 to a thickness which is greater than the thickness at which the deposited film ordinarily begins to exhibit dewetting defects, e.g., pinholes, such as caused by the defect mechanism referred to as nucleation and growth of holes. This film 202 can be referred to as a "target" film since the goal of processing is to produce a desirably thin target film.

After the film 202 is deposited, a second film 204 is deposited to overlie the target film 202. The second film 204 includes a material which interacts with the material of the target film under appropriate conditions so as to reduce the thickness of the target film from the originally deposited thickness 208 to a target thickness 210 (FIG. 6). As in the above-described embodiment, the target thickness 210 is less than a thickness at which the film 202 would begin to dewet from the substrate if it were originally deposited to that thickness 210. However, despite the reduction in thickness, the target film remains free of dewetting defects because the target film is stabilized, e.g., by heating, after it is deposited.

In a particular example, the target film is stabilized by an initial PAB, which causes a solvent to leave the target film but which does not cause the second film 204 to react significantly with the target film. Thereafter, once the target film has been sufficiently stabilized through the initial PAB, a second PAB is performed to stimulate the reaction between the reagent in the second film and the materials of the target film 202. When the target film includes a photoresist, the second film can contain an acid. One example of such acid-containing film is an anti-reflective coating (ARC) material having an acid content. In such case, the acid-containing ARC material can be referred to as an acid-containing "top ARC". In that case, heating the films causes the acid in the second film 204 to react with the photoresist material in the target film to reduce the thickness of the target film 202. However, despite the reduction in thickness, the target film remains free of dewetting defects.

FIG. 6 illustrates the result obtained after the thickness of the target film 202 has been reduced to the target thickness 210. Subsequently, the second film is removed from the surface of the target film 202 so that it no longer interacts with the target film to further reduce its thickness. Thereafter, further processing can be performed so as to photolithographically pattern the target film and pattern the underlying substrate 200 in accordance with the resulting patterned target film.

Alternatively, in a particular embodiment, the acid-containing second film 204 is allowed to remain after the PAB step as a second film covering the target film 202 when the photolithographic exposure is made. Then, following the exposure, the second film is removed, such as during a rinsing step with water or other solvent, after which a developer solution is applied to the exposed photoresist film to develop the photoresist image patterns. The thinning of the target film may occur either prior to the photolithographic exposure or afterwards, during post-exposure processing, aided by application of heat or a heated solvent, for example. Here, as in the above-described case, photoresist patterns are created which have small thickness to help protect against the above-described problem of photoresist line pattern collapse. Efficiencies are achieved when the second film is removed during the stage of developing the exposed photoresist, rather than during an intermediate step between the PAB and to the photolithographic exposure. In a further variation of this embodiment, the second film has properties that allow it to function as a top anti-reflective coating (ARC). In such case, the top ARC film benefits the photolithography process when the photoresist film is exposed. Usually, the top ARC would be removed after exposing the photoresist film, by rinsing before the exposed film is developed. However, in a variation of the above embodiment, the top ARC can be left on the target film until after the development of the photoresist patterns, to improve the erosion resistance of the photoresist patterns, such as when the image is transferred from the photoresist patterns to the underlying substrate.

Next, further explanation is provided to facilitate a deeper understanding of the factors which cause long-range van der Waals forces and the ways in which such forces are overcome in the embodiments of the invention disclosed herein. The long-range van der Waals forces and a Hamaker constant associated with the film or a stack of films determine the stability of a film stack. The free energy of a system consisting of any two materials separated by a medium of thickness h is given by the equation $$\phi_{vdW}(h) = -\frac{A}{12\pi h^2} \quad \text{Equation (1)}$$

where $\phi_{vdW}$ is the free energy due to van der Waals forces, and A is referred to as the Hamaker constant.

Figure 7:
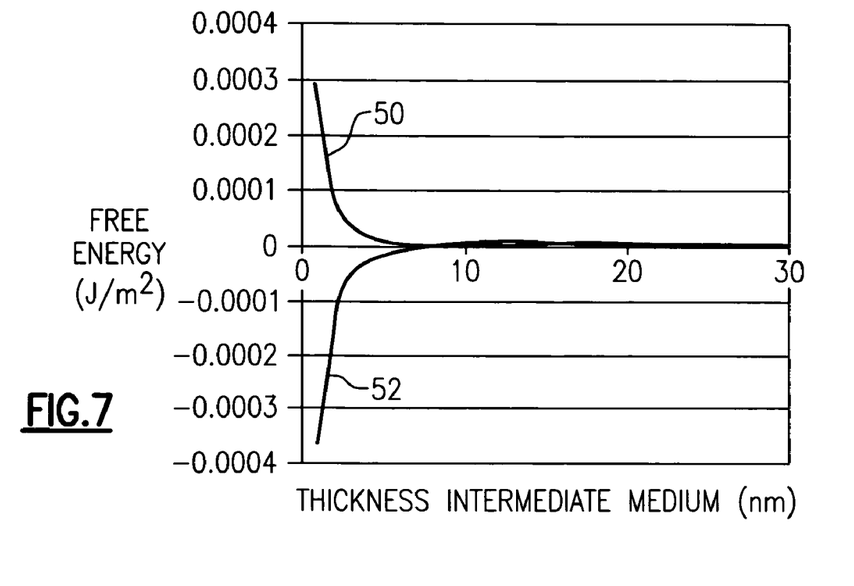
FIG. 7 is a graph depicting a free energy of a system for different intermediate films of different thicknesses.

FIG. 7 graphs a curve 50 representing $\phi_{vdW}$ for different thicknesses in which the film has a negative value Hamaker constant A with respect to the substrate, and a curve 52 representing $\phi_{vdW}$ for different thicknesses in which the film has a positive value Hamaker constant A with respect to the substrate. As apparent from FIG. 5, equation (1) shows that for any material having a positive Hamaker constant, any decrease in the thickness of the film decreases the free energy of the film stack. The reduction in free energy results in the film becoming unstable and dewetting the substrate below a minimum thickness to minimize the overall free energy of the system. On the other hand, when the Hamaker constant is negative, it is apparent from curve 50 that decreasing the thickness of the film actually increases the free energy. Thus, the film stack remains stable.

The second derivative of the free energy according to Equation (1), is determined by $$\phi_{vdW}(h) = -\frac{A}{2\pi h^4}. \quad \text{Equation (2)}$$

The zero in this curve determines the minimum thickness below which the deposited film is subject to spinodally dewetting from the substrate.

If a system consists of more than one intermediate medium, such as an arrangement in which a two-layered film stack is disposed between a substrate and an overlying medium, e.g., air, has free energy, which is determined by the equation:

$$\phi_{vdW}(h) = -\frac{A_2}{12\pi h^2} + \frac{A_2 - A_1}{12\pi (h+d)^2} \quad \text{Equation (3)}$$

where $A_1$ is the Hamaker constant of the overlying film having an outer surface contacted by the medium, h is the thickness of the overlying film, $A_2$ is the Hamaker constant of the under layer film which contacts the substrate, and d is its thickness.

Figure 8:
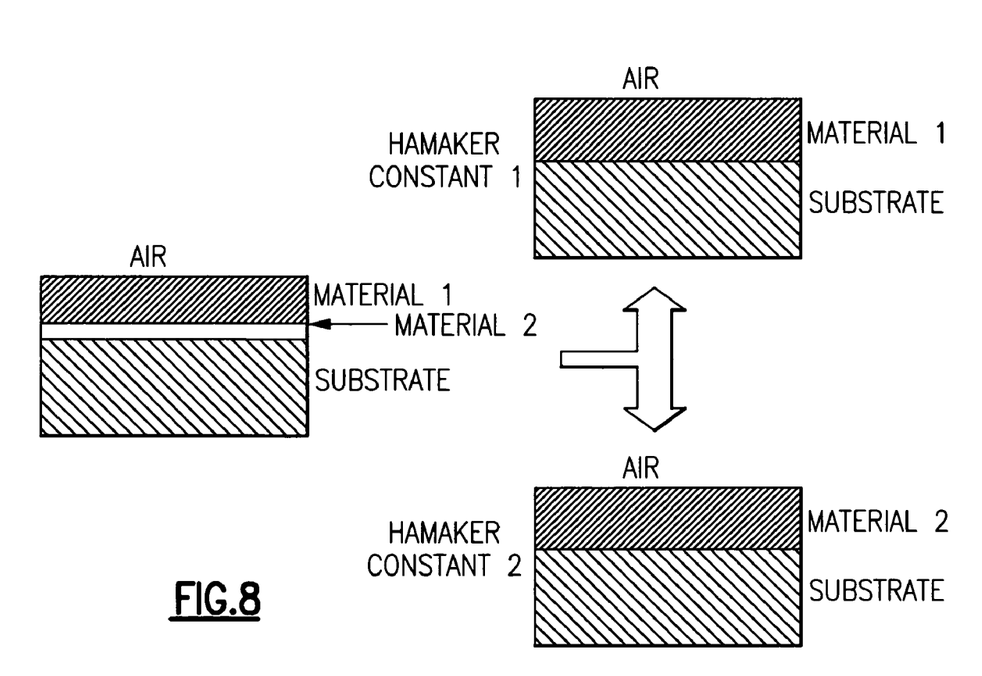
FIG. 8 is a diagram illustrating a principle of determining a Hamaker constant for a system including an overlayer film overlying an intermediate film disposed on a substrate.

Referring to FIG. 8, the overall free energy of a system can be sub-divided into the components related to the free energy of two individual systems. In other words, the Hamaker constant $A_1$ is the same as the van der Waals component related to the having material 1 separating the air and the substrate, and $A_2$ is the component related to having material 2 separating the air and the substrate. In this way, the Hamaker constants of each material can be calculated individually, and then combined to determine the overall free energy of the system.

The Hamaker constant of any two phases, such as labeled 1 (air) and 2 (substrate), interacting across a medium (material x), labeled as 3, can be calculated according to the equation:

$$A_1 = A_x = \frac{3kT}{4}\left(\frac{\varepsilon_1 - \varepsilon_x}{\varepsilon_1 + \varepsilon_x}\right)\left(\frac{\varepsilon_2 - \varepsilon_x}{\varepsilon_2 + \varepsilon_x}\right) + \quad \text{Equation (4)}$$

$$\frac{3h\nu_e}{8\sqrt{2}} \frac{(n_1^2 - n_x^2)(n_2^2 - n_x^2)}{(n_1^2 + n_x^2)^{\frac{1}{2}}(n_2^2 + n_x^2)^{\frac{1}{2}}\left\{(n_1^2 + n_x^2)^{\frac{1}{2}} + (n_2^2 + n_x^2)^{\frac{1}{2}}\right\}}$$

where $\varepsilon_1$ is the permittivity of the medium, $\varepsilon_2$ is the permittivity of the substrate, and $\varepsilon_x$ the permittivity of the first film, and $n_1$, $n_2$, and $n_x$ are the indices of refraction of the medium, the substrate, and the first film, respectively, k is the Boltzmann constant, T is temperature, h is Planck's constant and $\nu_e$ is the main electronic absorption frequency (usually $3.0 \times 10^{15} \text{s}^{-1}$). The Hamaker constant $A_2$ is a measure of the van der Waals component force determined for the under layer film with respect to the substrate, according to the equation $$A_2 = A_y = \frac{3kT}{4}\left(\frac{\varepsilon_1 - \varepsilon_y}{\varepsilon_1 + \varepsilon_y}\right)\left(\frac{\varepsilon_2 - \varepsilon_y}{\varepsilon_2 + \varepsilon_y}\right) +$$

$$\frac{3h\nu_e}{8\sqrt{2}} \frac{(n_1^2 - n_y^2)(n_2^2 - n_y^2)}{(n_1^2 + n_y^2)^{\frac{1}{2}}(n_2^2 + n_y^2)^{\frac{1}{2}}\left\{(n_1^2 + n_y^2)^{\frac{1}{2}} + (n_2^2 + n_y^2)^{\frac{1}{2}}\right\}}$$

where $\nu_e$ is the main electronic absorption frequency, $\varepsilon_1$ is the permittivity of the medium, $\varepsilon_2$ the permittivity of the substrate, and $\varepsilon_y$ the permittivity of said second thin film, and $n_1$, $n_2$, and $n_y$ are the indices of refraction of the medium, the substrate, and said second film, respectively and T is the temperature. In the above equations, the permittivities of the substrate, film and medium (air) can be replaced by the dielectric constants $k_i = \epsilon_i/\epsilon_0$ (k is the Boltzmann constant) for each, since the permittivities appear only in unitless factors.

It should be noted that the value of the dielectric constant and index of refraction are readily available for most materials, making the Hamaker constant easy to determine. Once the Hamaker constant of each layer is determined, by using equation (3), the stability of a system can also be determined.

As an example of a system will now be provided in which a thin film is disposed over an intermediate layer having properties which improve the adhesion of the thin film and reduce the risk of dewetting defects in the overlying thin film. In such example, the substrate is silicon dioxide, material 1 is polystyrene and material 2 is polytetrafluoroethylene (PTFE). The properties of these materials are listed in Table 1 below:

| | |
|---|---|
| $n_{SiOx}$ | 1.460 |
| $n_{Polystyrene}$ | 1.557 |
| $n_{PTFE}$ | 1.359 |
| $\epsilon_{SiOx}/\epsilon_0$ | 3.90 |
| $\epsilon_{Polystyrene}/\epsilon_0$ | 2.55 |
| $\epsilon_{PTFE}/\epsilon_0$ | 2.10 |

From this table of properties, the Hamaker constant is readily calculated for each of the polystyrene and PTFE materials individually, with respect to an arrangement which includes the substrate and only one overlying film, whether that be a polystyrene film or a PTFE film, and in which the coated substrate are disposed in a medium such as air which contacts the outer surface of the film. The results of these calculations are:

$$A_{Polystyrene} = 1.358 \times 10^{-20} J, \text{ and } A_{PTFE} = -1.070 \times 10^{-20} J$$

It is clear from the Hamaker constants that, individually, polystyrene is unstable as a film applied to an underlying substrate or underlayer of silicon dioxide. The Hamaker constant for PTFE indicates that that material is stable as a film on silicon dioxide.

With the above considerations in mind, FIGS. 9 through 13 illustrate a method of photolithographically patterning a substrate 300 according to a preferred embodiment of the invention. In this embodiment, a photoresist is deposited as a target film 302 overlying an intermediate film 301 which is deposited to overlie a major surface 306 of the substrate 300. Similar to the above-described embodiments, as initially deposited, the target film has a thickness which is greater than a thickness at which it would ordinarily begin to dewet from the surface 308 of the intermediate film 301 over which it is disposed. However, in this embodiment, the intermediate film 301 is preferably selected such that it has a negative Hamaker constant, and the film stack including the target film 302 overlying the intermediate film are such that a second derivative of the free energy for the film stack is positive. When the combination of the target film with the intermediate film has these properties, the thickness of the target film as deposited can be reduced, since the presence of the intermediate film increases the free energy of the film stack to a desirable level which reduces the risk that dewetting defects will occur.

Figure 9:
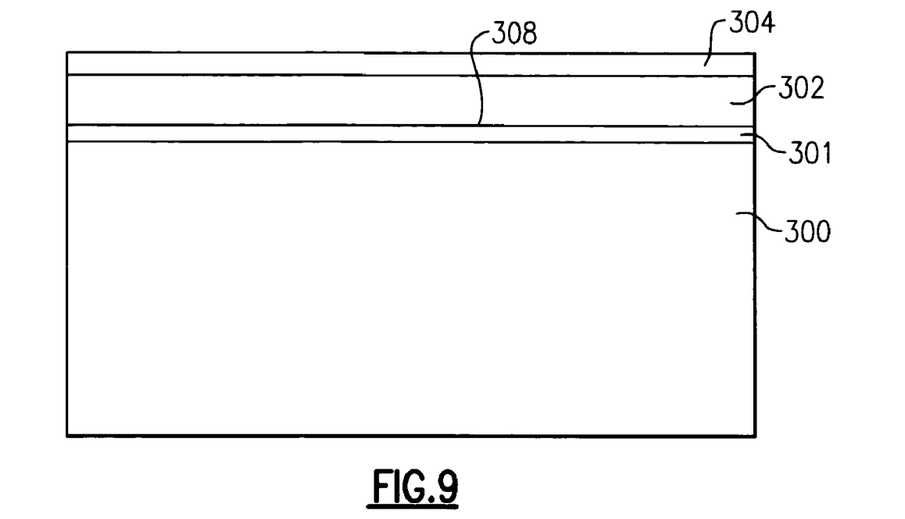
FIGS. 9 through 13 illustrate stages in a method of patterning a substrate according to an embodiment of the invention.
Figure 10:
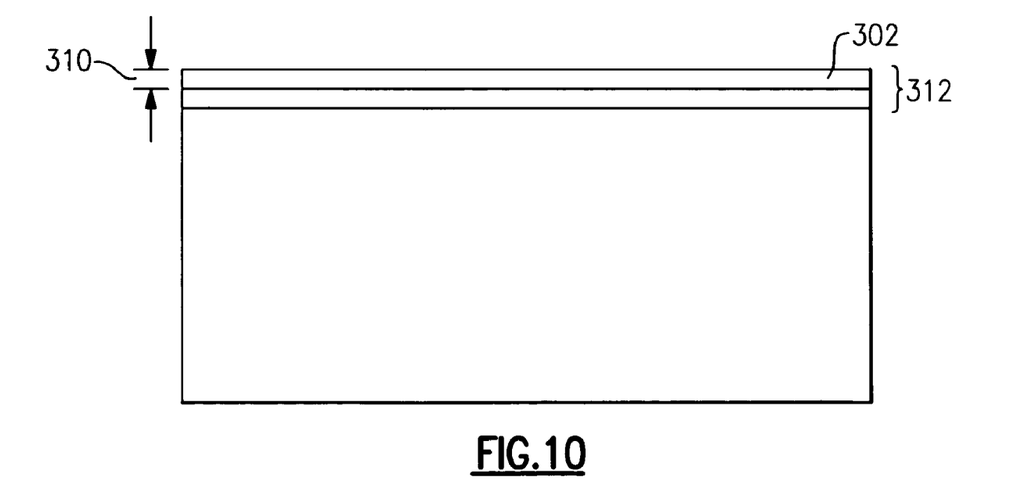

Preferably, the intermediate film is a bottom anti-reflective coating (ARC) 301 which is deposited thinly to a thickness of 2 to 3 nm, and the target film is a photoresist. After the photoresist film 302 is deposited, an acid-containing additional film 304 such as described relative to FIG. 5 above is deposited for the purpose of interacting with the target film to reduce the thickness of the target film. Upon sufficient heating, the acid from the acid-containing film 304 interacts with the underlying target photoresist film 302 causing the photoresist film to be etched back, causing the thickness of the target film 304 to decrease to a target thickness 310 (FIG. 10). FIG. 10 shows a stage of processing after the additional film has been removed, leaving the photoresist film 302 as the topmost film of a film stack 312 overlying the substrate 300.

Figure 11:
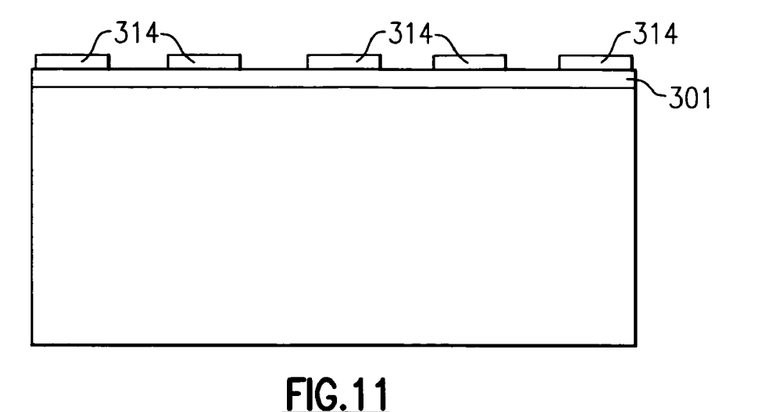
Figure 12:
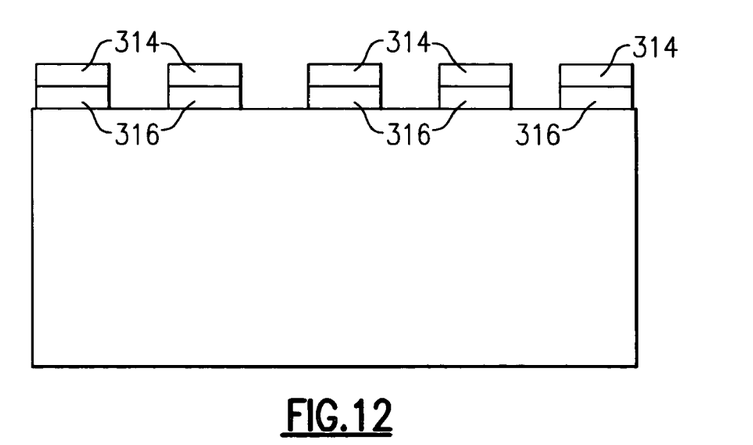
Figure 13:
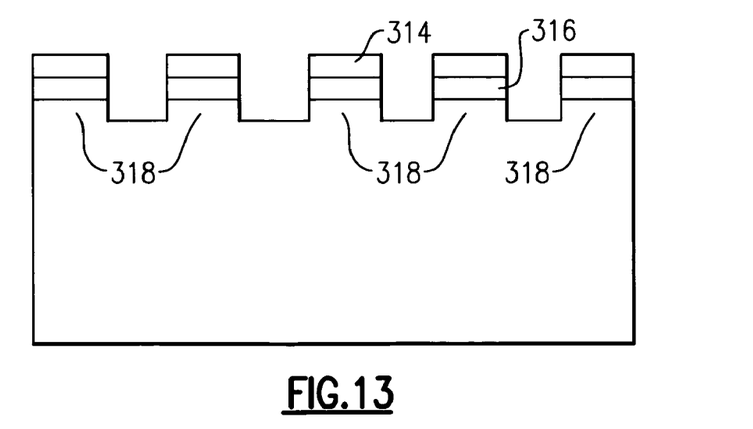

Thereafter, as shown in FIG. 11, the photoresist film 302 undergoes photolithographic exposure and development, resulting in the photoresist patterns 314 overlying the bottom ARC film 301. Thereafter, in a further stage of processing shown in FIG. 12, the bottom ARC film 301 is patterned according to the existing photoresist patterns 314, resulting in the formation of ARC patterns 316 under the photoresist patterns 314. Finally, once both the photoresist patterns 314 and the ARC patterns 316 are formed, the substrate 300 is patterned to form features 318.

As touched upon in the foregoing, advantages of a thinner photoresist film realized according to the embodiments of the invention are multifold. With a thinner photoresist film, the resist patterns formed therefrom are less likely to fall over after patterning. Another benefit is that a thinner photoresist film is better equipped to be fully exposed during photolithographic exposure. The thin photoresist film is more likely to be disposed within the focal plane of the exposure tool, perhaps allowing the exposure to be performed more easily than with thicker films. Thinner photoresist patterns are better equipped for the patterning of fine features in the substrate, e.g., during front end of the line (FEOL) patterning. For example, such thinner photoresist patterns are better equipped for patterning the semiconductor substrate and features disposed immediately above the semiconductor substrate, such as to form transistors.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming a thin film, comprising:
    depositing a first film to overlie a substrate;
    depositing another film having a first thickness to overlie said first film over said substrate such that said first film is an intermediate film between said another film and said substrate, said first thickness being greater than a thickness at which said another film is subject to dewet from said substrate, said another film including at least one material selected from a photoresist and an antireflective coating, wherein said intermediate film has a stabilizing effect upon said another film, said intermediate film having a dielectric property such that a film stack including said intermediate film and said another film overlying said substrate is characterized by a second derivative of a free energy for said film stack having a positive value;
    stabilizing said another film to form a stabilized film;
    depositing a second film to overlie said stabilized film;
    thinning said stabilized film to a second thickness by causing interaction between said stabilized film and said second film, said interaction including reacting a polymeric material of said stabilized film with an acid of said second film, said second thickness being less than said thickness at which said another film is subject to dewet as initially deposited, wherein said stabilized film having said second thickness remains free of dewetting defects.

2. The method as claimed in claim 1, wherein said step of stabilizing said another film includes heating said another film to cause a solvent present in said another film to leave.

3. The method as claimed in claim 1, wherein said step of thinning said stabilized film includes etching said stabilized film.

4. The method as claimed in claim 1, wherein said interaction between said stabilized film and said second film is caused by heating.

5. A method of forming photoresist patterns from a thin film formed according to the method claimed in claim 4, wherein said another film is a photoresist such that said thinned stabilized film is a thinned photoresist film, said method comprising photolithographically patterning said thinned photoresist film to form photoresist patterns.

6. A method of photolithographically patterning a substrate using photoresist patterns formed according to the method claimed in claim 5, comprising patterning said substrate using said photoresist patterns.

7. The method as claimed in claim 5, wherein said intermediate film includes an antireflective coating ("ARC").

8. A method of photolithographically patterning a substrate using photoresist patterns formed according to the method claimed in claim 7, comprising using said photoresist patterns to pattern said ARC to form ARC patterns, and patterning said substrate using said photoresist patterns and said ARC patterns.

9. The method as claimed in 1, wherein said intermediate film has a negative Hamaker constant.

10. The method as claimed in claim 1, wherein said free energy is determined in accordance with an equation:

$$\phi_{vdW}(h) = -\frac{A_2}{12\pi h^2} + \frac{A_2 - A_1}{12\pi(h+d)^2}$$

where $A_1$ is the Hamaker constant of the initially deposited film having an outer surface contacted by the medium, h is the thickness of the initially deposited film, $A_2$ is the Hamaker constant of the intermediate film which contacts the substrate, and d is its thickness.

11. A method of forming photoresist patterns, comprising:
    forming an antireflective coating (ARC) overlying a substrate, said ARC having a negative Hamaker constant;
    initially depositing a photoresist film having a first thickness over said ARC such that said ARC is an intermediate film between said photoresist film and said substrate, said first thickness being greater than a thickness at which said photoresist film begins to dewet from said substrate when deposited directly onto said ARC;
    stabilizing said initially deposited photoresist film to form a stabilized photoresist film;
    thinning said stabilized photoresist film to a second thickness, said second thickness less than said thickness at which said photoresist film is subject to dewet from said ARC as initially deposited; and
    photolithographically patterning said thinned photoresist film to form photoresist patterns;
    using said photoresist patterns to pattern said ARC to form ARC patterns;
    patterning said substrate using said photoresist patterns and said ARC patterns,
    wherein said intermediate film has a dielectric property such that a film stack including said intermediate film and said Initially deposited film overlying said substrate is characterized by a second derivative of a free energy for said film stack having a positive value.

* * * * *